United States Patent [19]

Lee et al.

[11] 4,380,795
[45] Apr. 19, 1983

[54] BASE DRIVE CIRCUIT FOR A FOUR-TERMINAL POWER DARLINGTON

[75] Inventors: Fred C. Lee, Blacksburg; Roy A. Carter, Salem, both of Va.

[73] Assignee: The United States of America as represented by the United States Department of Energy, Washington, D.C.

[21] Appl. No.: 246,975

[22] Filed: Mar. 24, 1981

[51] Int. Cl.³ ............................................. H02M 7/537
[52] U.S. Cl. .................................... 363/131; 363/124; 318/811
[58] Field of Search ...................... 318/345 B, 801, 811; 363/124, 131, 132; 307/300, 315, 254

[56] References Cited

U.S. PATENT DOCUMENTS

| | | | |
|---|---|---|---|
| 2,663,806 | 12/1953 | Darlington | 307/299 X |
| 3,003,108 | 10/1961 | Thiele | 307/315 X |
| 4,233,529 | 11/1980 | Whitlock | 307/315 X |

FOREIGN PATENT DOCUMENTS 2025180  1/1980  United Kingdom ................ 307/315

OTHER PUBLICATIONS

"A New Base Drive Scheme for Transistorized Electrical Vehicle Propulsion", R. A. Carter and F. C. Lee, Power Car Conference, Mar. 25, 1980.

Primary Examiner—William M. Shoop
Attorney, Agent, or Firm—Steven M. Rabin; Richard G. Besha; James E. Denny

[57] ABSTRACT

A high power switching circuit which utilizes a four-terminal Darlington transistor block to improve switching speed, particularly in rapid turn-off. Two independent reverse drive currents are utilized during turn off in order to expel the minority carriers of the Darlington pair at their own charge sweep-out rate. The reverse drive current may be provided by a current transformer, the secondary of which is tapped to the base terminal of the power stage of the Darlington block. In one application, the switching circuit is used in each power switching element in a chopper-inverter drive of an electric vehicle propulsion system.

6 Claims, 9 Drawing Figures

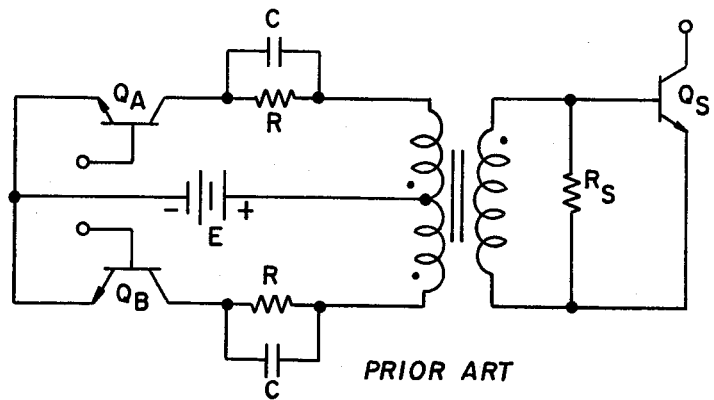
PRIOR ART
Fig. 3
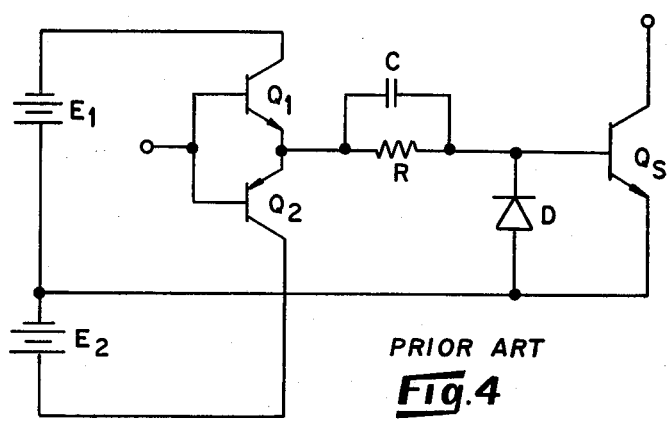
PRIOR ART
Fig. 4
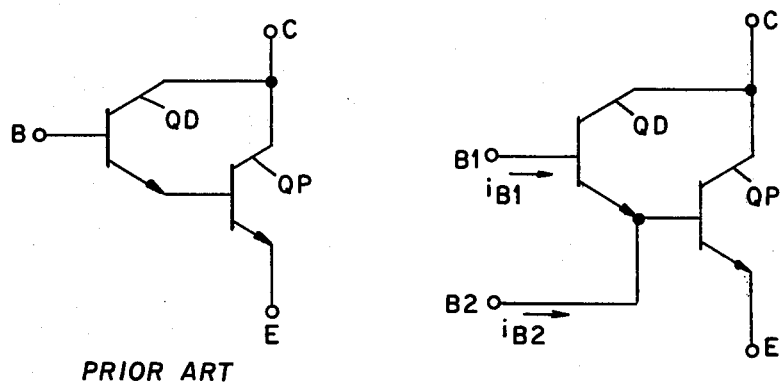
PRIOR ART
Fig. 5
Fig. 6

BASE DRIVE CIRCUIT FOR A FOUR-TERMINAL POWER DARLINGTON

FIELD OF THE INVENTION AND CONTRACT STATEMENT

This invention relates generally to a transistorized power switch and a base drive circuit therefore and more particularly to such a switching circuit which utilizes a four-terminal power Darlington and a base drive scheme providing for fast turn-off. The United States Government has rights in this invention pursuant to Contract No. DEN 3-65 funded by the U.S. Department of Energy between the National Aeronautics and Space Administration and the Virginia Polytechnical Institute and State University.

BACKGROUND OF THE INVENTION

One of the major effects in reducing the size and weight of electronic power processing systems is directed toward developing high power, fast switching semiconductor devices. Several penalties are induced when silicon controlled rectifiers (SCR) are employed as switching devices. Due to high conduction losses, slow switching speeds, and complex commutation schemes, the SCR has been forced to take a less active role in power and control electronics, especially when high-efficiency power supplies and high-frequency motor drives are deemed desirable. These inherent limitations of the SCR device has hastened the development of its counterpart—power transistors.

In recent years, the increasing availability of high power transistors has opened many new avenues for power electronic applications. High-frequency, low-switching losses and relatively simple commutation schemes are just a few advantages of the power transistor over the SCR. With the present semiconductor device technology, power transistors with a capacity of $V_{CBO}=600$ V, $I_C=300$ A can be manufactured on a single wafer. The development of giant transistors now make it possible to extend their application to higher power processing, such as motor drives, inverters, choppers, and uninterrupted power supplies which were predominated by SCR devices in the past. In particular, the large power transistor has been used in an Ac drive system as shown in FIG. 1 for a brushless permanent magnet motor for electric vehicle propulsion.

The power conditioner of the drive system consists of a chopper and inverter. The chopper regulates the current to provide torque control and the inverter supplies the 3-phase current needed to drive the Ac permanent magnet machine to propel the vehicle. The chopper uses a fast-switching power Darlington for high operating frequencies and low losses demanded by an efficient DC-DC converter. For the relatively low frequency inverter, the rugged, slow-switching power Darlington is used. However high current transistors do not achieve the switching speed performance comparable to their narrow-base-width, low-current counterparts. The physical width of the base must be increased for the power transistor to support higher voltages and currents. Increasing the base width lowers the current gain. To provide the high gain desired, the power Darlington configuraton is used.

The poor switching performance of conventional high power transistorized switches is most recognizable during the turn-off period. The relatively slow turn-off is due to a sluggish sweep-out of minority carriers in the base region. The shift in conduction from the periphery of the emitter to the center causes an increase in the resistance between the base terminal and the emitter terminal. Because of the high series base resistance, an effective reverse drive is needed to facilitate a quick turn-off.

Various schemes have been developed to solve the slow turn-off problem. Described below are several commonly used base drive techniques.

FIG. 2 illustrates a capacitively coupled turn-off circuit. When transistor Q1 is off the totem pole output (pin 5) of the 555 timer is high so that transistor QA is forward biased. An initial high current provides quick turn-on until capacitor C is charged. With transistor Q1 on, pin 5 goes low, turning on transistor QB which provides reverse current to turn off transistor QS.

The advantages of the capacitively coupled scheme are the elimination of a negative, isolated supply, capability of quick turn-on and the simplicity of the drive in operation. The principal limitation of the capacitively coupled turn-off circuit is in the finite amount of charge that can be stored in the capacitor C. For a low power switch this circuit is very practical. But for a high power transistor the limited amount of charge on capacitor C would be less effective in sweeping out the minority carriers for a rapid turn-off.

A pulse transformer is often used for triggering the latching transistor. FIG. 3 illustrates the use of this type of magnetic coupling. When transistor $Q_A$ turns on, primary current goes into the dot shown in the figure producing a current flowing out of the dot in the secondary to turn transistor $Q_S$ on. Transistor $Q_B$ is switched on to provide the opposite effect on the secondary which supplies the reverse current to facilitate a quick turn-off.

Initial high influx of current on both turn-on and turn-off states due to capacitor C aids in quick switching action. Unfortunately, the magnitude limitation on the saturation flux density and the finite cross sectional area of the magnetic core does not allow full on or high percentage on-time capabilities.

FIG. 4 examplifies the dual supply approach. Here transistor $Q_1$ switches on to provide forward drive for the power transistor $Q_S$. For the turn off, transistor $Q_2$ is switched on delivering a reverse current to the base-emitter junction which sweeps out the minority carriers of transistor $Q_S$. The diode D is used to protect against a high voltage being established across the base-emitter junction caused by the high base-emitter series resistance during the fall time of the turn-off.

Although the circuit requires two power supplies, this base drive allows full on time and delivers reverse biasing during the full off time period no matter how long. The circuit also provides quick turn on via capacitor C parallel to resistor R.

The various styles of turn-off described above are effective for their respective purposes: The capacitively coupled turn-off circuit is excellent for low-power applications. But for high power transistors the capacitor would not be able to store enough charge to effectively turn off the power transistor. The pulse transformer coupling scheme lends itself well for input-output isolation. However, the circuit is rendered inoperative when the power switch is functioning under extreme duty cycle conditions, because of the finite amount of magnetic flux which may be stored in the transformer core. The dual power supply is an adequate candidate for large power devices. But the dual supplies add extra hardware and cost to the the base drive scheme.

Thus, the conventional base drive schemes discussed above are excellent for low power and limited usage, with the exception of the dual power supply approach. As the power level increases, so do the constraints on the power switch. The higher power handling capability of transistors requires higher injection levels of dopant on the base region. In turn, the emitter efficiency is lowered and the series base-emitter resistance is increased. The high series base-emitter resistance inhibits the charge sweep-out rate. Prior base drive circuits do not provide the healthy reverse drive current needed to hasten the charge sweep-out rate of the minority carriers to provide a rapid turn-off.

As the power handling capacity of the transistor increases the current gain reduces. This is due to lower emitter efficiency caused by high-level injection which is aggravated by current crowding. With the lower current gain, either the base drive must be revamped to handle the current needed to successfully turn the switching device on and off proficiently, or a Darlington pair must be used to provide the gain needed to keep the base current at a respectable level.

However, the conventional three-terminal Darlington configuration has an inherent turn-off problem—the uncontrollable charge sweep-out rates. Referring to FIG. 5 the outer power transistor QP requires more time to turn off due to the charge build up in the base region caused by the large drive current of the driver transistor QD. With a larger minority carrier storage, the outer transistor requires heavier drive to sweep the minority carriers off the periphery of the base region than does the driver transistor. The problem develops here because as soon as the conduction shifts to the center of the emitter of transistor QD, the series base-emitter resistance increases, reducing the effectiveness of the reverse drive current on transistor QP. Therefore transistor QP turn-off speed is limited by the amount of current transistor QD will allow during its fall time.

OBJECTS AND BRIEF SUMMARY OF THE INVENTION

Thus it is an object of the present invention to provide a base drive circuit which has rapid turn-off for high-power Darlington transistors to be used in a power conditioner for an AC motor operable at high duty cycles.

It is another object of the present invention to provide a base drive circuit requiring only one power supply which has rapid turn-off and which can be used in a power conditioner for an AC motor.

It is still another object of the present invention to provide a base drive for a four-terminal power Darlington which facilitates for rapid turn-off.

It is a further object of the invention to provide a base drive for a power Darlington which provides for rapid turn-off using a single power supply and two independent reverse base-drive current loops.

The inventors have found that the Darlington power transistor is an effective power switch, particularly for high power applications such as for electric vehicle propulsion, and that the above described problems of the three-terminal Darlington may be overcome, and rapid turn-off may be accomplished, by using a four-terminal power Darlington such as is illustration FIG. 6, and applying reverse current through the emitter-base junction of both the power stage and the driver stage.

In accordance with one aspect of the invention an electrical power switching device is provided which includes a four-terminal power Darlington transistor and means for applying independent reverse currents to the emitter-base junctions of the driver and power stages of the Darlington transistor so as to independently sweep the minority carriers out of the base-emitter junctions, thereby rapidly turning off the driver and power stages at their own respective sweep-out rates.

In accordance with another aspect of the invention the reverse base current applying means includes a current transformer. In accordance with a further aspect of the invention the tapped secondary winding of the transformer is connected to the base of the power stage of the Darlington transistor as shown in FIG. 7 whereby the tapped secondary winding provides separate reverse currents through the respective base-emitter junctions of the driver and power stages of the Darlington transistor.

In accordance with a still further aspect of the invention the above described switching devices are provided in the chopper and inverter of an AC motor drive system which includes a power conditioner comprising an inverter for supplying multiphase current to drive the motor and a chopper, coupled to the inverter, for regulating current to provide torque control to the motor.

BRIEF DESCRIPTION OF THE DRAWINGS

These and other aspects and objects of the invention are apparent from the following detailed description of the preferred embodiment when considered with the accompanying drawings in which:

FIG. 3 is a schematic diagram of a pulse transformer coupling circuit of the prior art;

FIG. 4 is a schematic diagram of a prior art dual supply turn-off circuit;

FIG. 5 illustrates a prior art three-terminal Darlington transistor;

FIG. 6 illustrates a simplified four-terminal power Darlington transistor;

DETAILED DESCRIPTION OF THE PREFERRED EMBODIMENT

Figure 1:
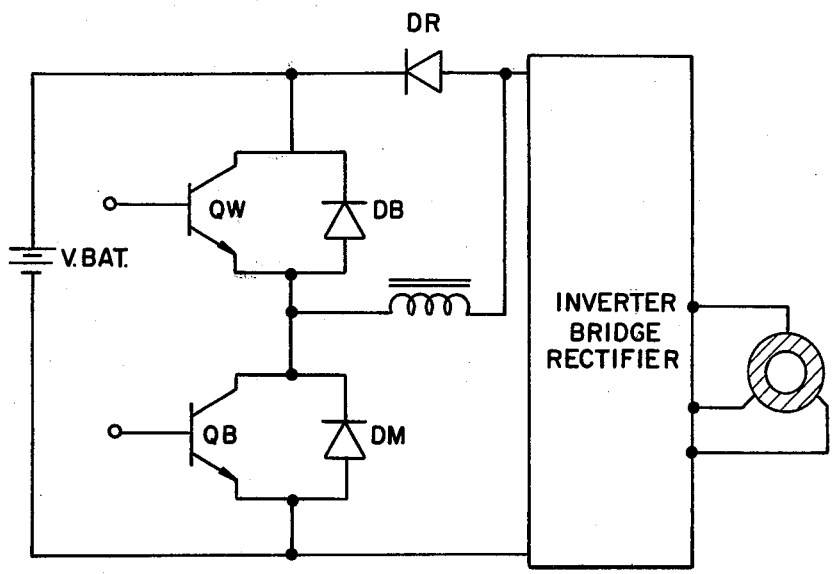
FIG. 1 is a simplified schematic diagram of a motor power conditioner in accordance with the present invention.
Figure 2:
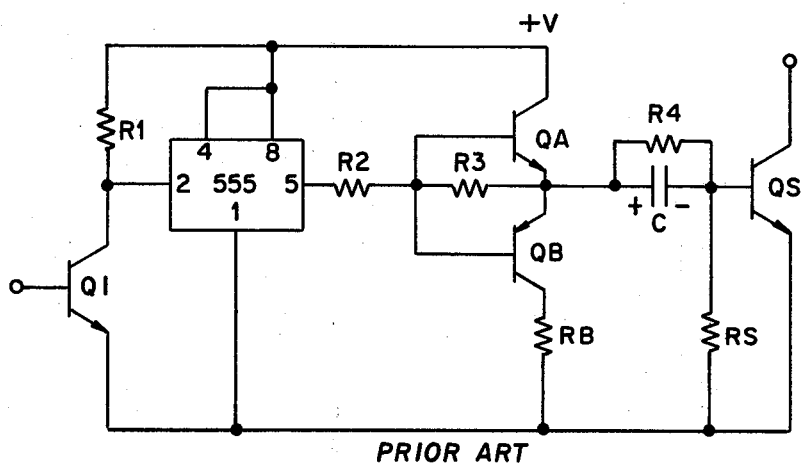
FIG. 2 is a schematic diagram of a capacitively coupled turn-off circuit of the prior art.
Figure 7:
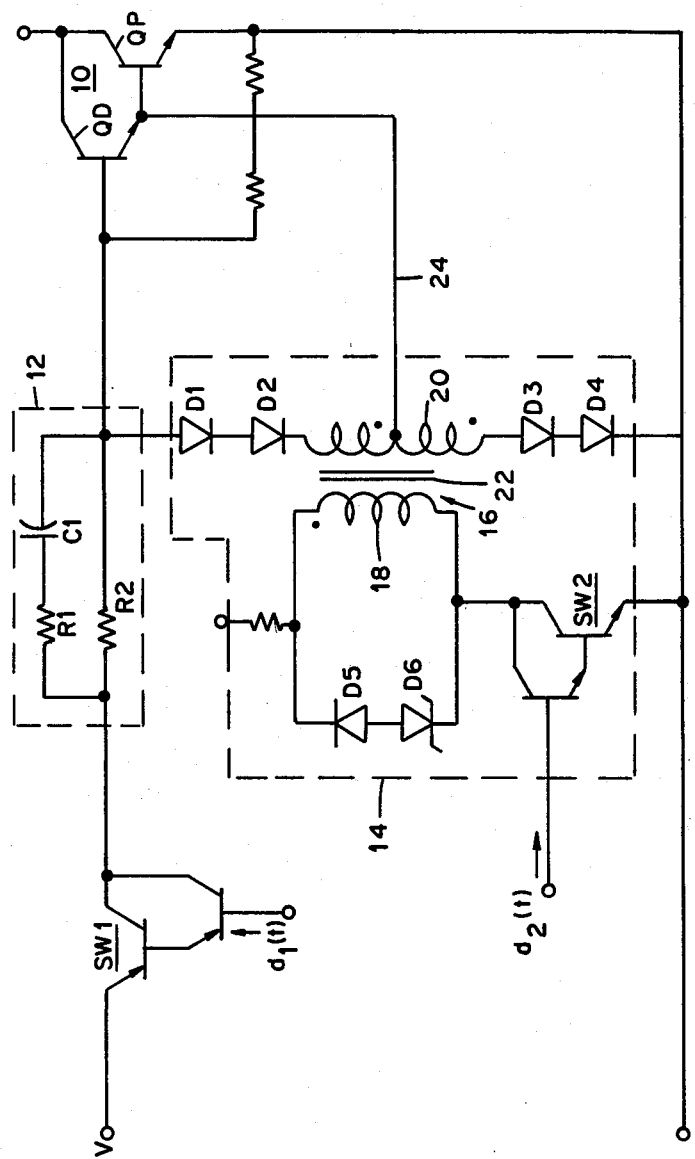
FIG. 7 is a schematic diagram of a simplified base drive circuit in accordance with the present invention.

Referring first to FIG. 7, the electric power switching device of the present invention includes a four-terminal power Darlington transistor 10 consisting of a driver stage QD and a power stage QP. The base of the driver stage is driven in the positive mode through a switch SW1 in response to a signal $d_1(t)$ through an RC circuit 12. In accordance with the present invention, a transformer circuit 14 has the ability to provide two reverse circuits independent of each other to the emitter-base junctions of the driver stage QD and power stage QP of the Darlington transistor 10, allowing these stages to be turned off at their own charge sweep-out rates. Circuit 14 includes a current transformer 16 having a primary 18, a secondary 20 and a core 22 and a conductor 24 which taps the secondary 20 into the base terminal of power stage QP. Secondary 20 is connected between the base terminal of the driver stage QD and the emitter terminal of the power stage QP through diodes D1, D2, D3 and D4. One end of primary 18 is connected to a DC voltage source, the other end being grounded through a transistor switch SW2 in response to a signal $d_2(t)$ at the transistor base.

As shown in FIG. 7, when $d_1(t)$ is clocked off, signal $d_2(t)$ is clocked on for a predetermined length of time. The pulse width of $d_2(t)$ is proportional to the amount of time needed to fully turn off the switching device. With $d_2(t)$ clocked high, a high influx of current enters the primary 18 at the dot shown in FIG. 7. By transformer action, a current is induced in the tapped secondary which supplies two independent currents for reverse biasing the device. The magnitude of current needed for the driver stage and the power stage loop is dictated by the amount of minority carriers stored in the base-emitter junction of each stage, respectively. After the switching device has been cut off, the switch SW2 on the primary side of the transformer is opened. The flux is then reset due to the non-ideal nature of the magnetic core 22. The small amount of energy stored in the core 22 as magnetizing current is dissipated across the conventional semi-conductor diode D5 and zener diode D6 parallel to the primary winding 18.

Along with the reverse current to facilitate a quick turn-off, it is desirable that the base drive should have the means to turn on the power transistor rapidly. By driving a pulse into the switch at the beginning of each turn-on cycle, the rise time will improve appreciably. RC circuit 12 provides this initial pulse. Diodes D1, D2, D3 and D4 on transformer secondary 20 provide a high impedance path during the on-state of the power Darlington to prevent any base-drive current from being shunted to the ground.

Figure 8:
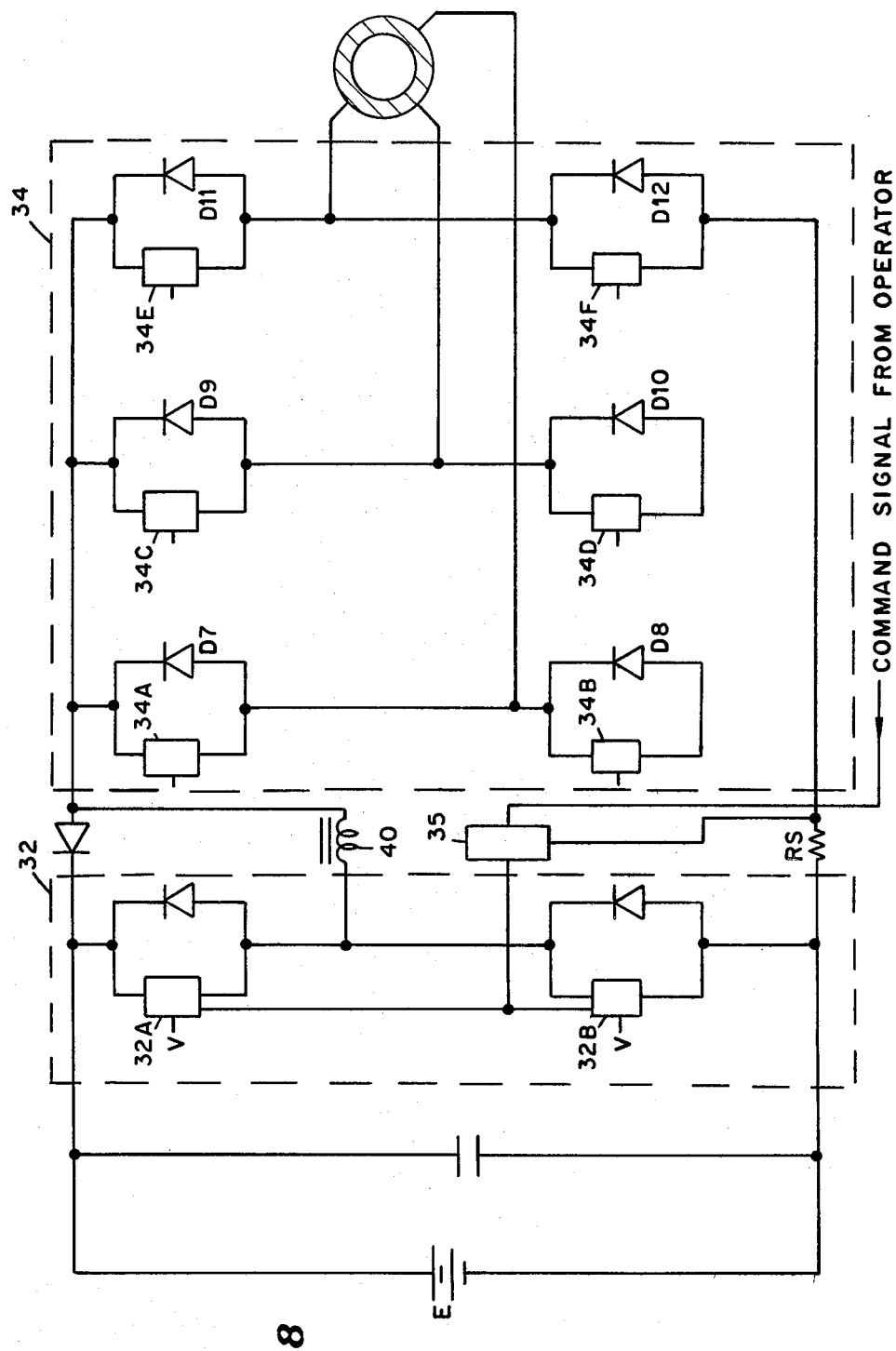
FIG. 8 is a schematic diagram of an AC motor and power conditioner in accordance with one application of the present invention.

The four-terminal power Darlington and base drive described above may be used in an AC drive system for a brushless permanent magnet motor for electrical vehicle propulsion such as is illustrated in FIG. 8. The power conditioner of the system consists of a 2-quadrant chopper 32 and a three-phase inverter 34. Chopper 32 includes two power Darlington switches and corresponding base drive circuits 32A and 32B. The chopper 32 regulates the current to provide a torque control for both motoring and regenerative braking modes. The duty cycle of the chopper 32 (defied by $d_1(t)$ is controlled by interaction in a two-level threshold control (hysteresis control) 35 of a torque (current) command signal given by the vehicle operator and the signal picked off of the current shunt RS which is connected in series with the line current return path. The chopper is operated at variable frequencies determined by the system time constant and the motor speed. The six-transistor block inverter bridge 34 is activated through a Hall-effect rotor position sensor (not shown in FIG. 8) to provide a variable frequency three-phase current waveform synchronized with the motor speed. Inverter 34 includes six power Darlington switches and corresponding base drive circuits 34A-34F. A choke 40 and the relatively high chopping frequency of the chopper serve to smooth the line current entering the three-phase inverters. The inverter diodes D7-D12 function during commutation of the phase currents in the motoring mode and also serve as the rectifier bridge during regeneration. The system illustrated in FIG. 8 is shown and described in even greater detail in a paper entitled "A Transistorized Chopper-Inverter Control for Electric Passenger Vehicle Propulsion," International Power Convention, Conference Proceedings, Munich, West Germany, September 1980, by Fred C. Lee, D. J. Schortt and R. A. Carter, the contents of which is hereby incorporated herein by reference.

Figure 9:
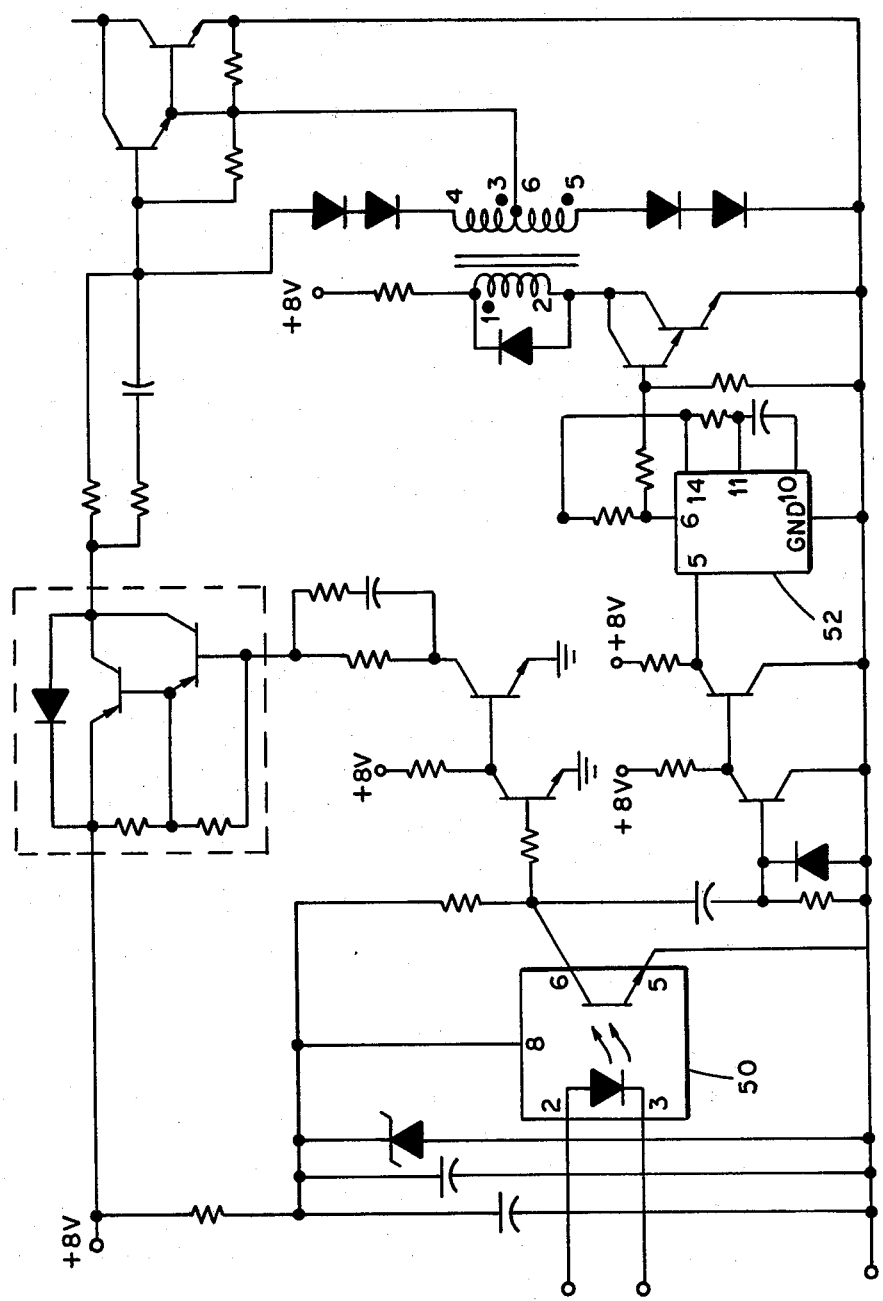
FIG. 9 is a more detailed diagram of the base drive circuit of the present invention.

Referring to FIG. 9, there is shown an exemplary base drive circuit for use in the chopper and inverter bridge illustrated in FIG. 8.

Each of the power Darlington transistors and base drive circuits 32A, 32B and 34A-34F represented in FIG. 8 are shown in detail in FIG. 9. FIG. 9 is similar to FIG. 7 but in addition illustrates the sources of switch turn-on signals $d_1(t)$ and $d_2(t)$. The base drive comprised a device 50 which in each of the base drives of the inverter is optically coupled to the Hall-effect rotar position sensor to isolate the command signal from the rest of the circuit. In the chopper the device 50 receives its signal input from hysteresis control 35. The signal $d_2(t)$ is provided by a monostable multi-vibrator 52 which controls the switching time on the primary side of the current transformer 16.

For a power conditioner designed to feed, for example, a 15-hp, 120 volt, 4 pole, 7600 rpm samarium cobalt permanent magnet motor of 35-hp 1 minute peak rating, the two chopper Darlingtons are suitably a high frequency, triple-defused power Darlington block such as the MT 1144 block manufactured by Power Tech Corporation of Clifton, NJ. The inverter 34 suitably employes the rugged single-defused powered Darlington such as the MT 1146 block manufactured by Power Tech Corporation of Clifton, NJ.

Tests performed on the circuit illustrated in FIG. 9 by the inventors confirmed that the reverse base current kicked through the driver stage QD takes much less energy to turn off than the energy needed to cut off the power stage QP. The longer period of time for the reverse base current through the power stage QP is due to a charge build up in the base region caused by the larger driver current. Therefore, the power stage requires more time to sweep the minority carriers off the periphery of its base region than does the driver stage. With the two-loop turn-off control of the present invention, one can also perceive that the turn-off rate of the power and driver stages are independent of each other. Therefore, the quicker turn-off of the driver stage would not prohibit the amount of reverse current needed to effectively turn off the power device. The independent loop control allows both stages of the power Darlington to be cut off at their own charge sweep-out rates.

The foregoing description of a preferred embodiment of the invention has been presented for purposes of illustration and description. It is not intended to be exhaustive or to limit the invention to the precise form disclosed and obviously many modifications and variations are possible in light of the above teaching. The embodiment was chosen and described in order to best explain the principles of the invention and its practical application to thereby enable others skilled in the art to best utilize the invention and various embodiments and with various modifications as are suited to the particular use contemplated. It is intended that the scope of the invention be defined by the claims appended hereto.

What is claimed is:

1. An electrical power switching device, comprising:
   a. a four-terminal power Darlington including a first driver transistor stage having a first base and a second power transistor stage having a second base coupled to the emitter of said first transistor stage; and
   b. means for respectively applying first and second independent reverse currents to the emitter-base junctions of said first and second transistor stages so as to independently sweep the minority carriers out of said emitter-base junctions, thereby turning off said driver stage and said power stage at their own respective sweep-out rates wherein said reverse current applying means includes a current transformer.

2. An electrical power switching device as in claim 1 wherein said power source comprises the primary winding of said current transformer.

3. An electrical power switching device as in claim 2 wherein said reverse current applying means comprises means, including a tap off of the secondary winding of said transformer to said second base, for applying a first voltage from said secondary winding across the base-emitter junction of said first driver transistor stage and a second voltage from said secondary winding across the base-emitter junction of said second power transistor stage.

4. An electrical power switching device as in claim 3 further comprising switch means for applying a prescribed length voltage pulse to said primary.

5. In an AC motor drive system including a DC power supply, a power conditioner comprising an inverter for supplying multiphase current to drive the motor and a chopper coupled to the inverter for regulating current to provide torque control to the motor, the chopper and inverter including a plurality of electrical power switching devices, each device including:
   a. a four-terminal power Darlington including a first driver transistor stage having a first base and a second power transistor stage having a second base coupled to the emitter of said first transistor stage; and
   b. means for respectively applying first and second independent reverse currents to the emitter-base junctions of said first and second transistor stages so as to independently sweep the minority carriers out of said emitter-base junctions, thereby turning off said driver stage and said power stage at their own respective sweep-out rates, said reverse current applying means including a current transformer.

6. In the AC motor drive system of claim 5, wherein said reverse current applying means comprises means, including a tap off of the secondary winding of said transformer to said second base, for applying a first voltage from said secondary winding across the base-emitter junction of said first driver transistor stage and a second voltage from said secondary winding across the base-emitter junction of said second power transistor stage.

* * * * *